(12) United States Patent
Toyota et al.

(10) Patent No.: US 8,860,294 B2
(45) Date of Patent: Oct. 14, 2014

(54) LIGHT EMITTING ELEMENT AND METHOD FOR MANUFACTURING THE SAME

(75) Inventors: Tatsunori Toyota, Tokyo (JP); Yutaka Ohta, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 34 days.

(21) Appl. No.: 13/513,015

(22) PCT Filed: Dec. 8, 2010

(86) PCT No.: PCT/JP2010/072018
§ 371 (c)(1),
(2), (4) Date: Aug. 10, 2012

(87) PCT Pub. No.: WO2011/071077
PCT Pub. Date: Jun. 16, 2011

(65) Prior Publication Data
US 2012/0299465 A1 Nov. 29, 2012

(30) Foreign Application Priority Data

Dec. 8, 2009 (JP) .................................. 2009-278823
Dec. 6, 2010 (JP) .................................. 2010-271542

(51) Int. Cl.
H05B 33/12 (2006.01)
H05B 33/10 (2006.01)
H01L 33/38 (2010.01)
H01L 33/20 (2010.01)

(52) U.S. Cl.
CPC ............ *H01L 33/382* (2013.01); *H01L 33/385* (2013.01); *H01L 33/20* (2013.01)
USPC 313/498; 445/58; 257/E33.002; 257/E29.089

(58) Field of Classification Search
CPC .................................................... H01L 33/382
USPC ................... 313/498–512; 445/58; 257/615, 257/E29.089, 79–103, E21, E21.09, 257/E33.023, E31.027
See application file for complete search history.

(56) References Cited

U.S. PATENT DOCUMENTS

| | | | |
|---|---|---|---|
| 2006/0192223 A1* | 8/2006 | Lee et al. | 257/99 |
| 2007/0085095 A1* | 4/2007 | Ko et al. | 257/94 |
| 2010/0019247 A1 | 1/2010 | Joichi et al. | |
| 2010/0044744 A1 | 2/2010 | Kim et al. | |

FOREIGN PATENT DOCUMENTS

| | | |
|---|---|---|
| JP | A-10-223930 | 8/1998 |
| JP | A-2001-308380 | 11/2001 |

(Continued)

OTHER PUBLICATIONS

Jan. 25, 2011 International Search Report issued in PCT/JP2010/072018 (with translation).

*Primary Examiner* — Elmito Breval
(74) *Attorney, Agent, or Firm* — Oliff PLC (57) ABSTRACT

To provide a light emitting element, having: a lamination structure including a first conductive layer and a second conductive layer with a light emitting layer interposed between them; a groove structure in which the second conductive layer and the light emitting layer are divided into large and small two parts; a second conductive electrode pad that is electrically connected to the second conductive layer on the divided larger second conductive layer, a first conductive electrode pad on the divided smaller second conductive layer, and two or more electrical contacts connected to the first conductive layer so as to be independent from each other, by a conductive wiring extending to the first conductive layer, with the first conductive electrode pad as a start point.

4 Claims, 9 Drawing Sheets

(56) References Cited

FOREIGN PATENT DOCUMENTS

| JP | A-2002-319704 | 10/2002 |
| JP | A-2003-110139 | 4/2003 |
| JP | A-2005-328080 | 11/2005 |
| JP | A-2008-277358 | 11/2008 |
| JP | A-2009-094089 | 4/2009 |
| WO | WO 2008/038842 A1 | 4/2008 |

\* cited by examiner

LIGHT EMITTING ELEMENT AND METHOD FOR MANUFACTURING THE SAME

TECHNICAL FIELD

The present invention relates to a light emitting element used as LED, etc., and a method for manufacturing the same.

DESCRIPTION OF RELATED ART

In recent years, progress of a semiconductor light emitting element such as LED is remarkable. Specifically, an attempt to increase a light emitting intensity has been in progress.

For example, patent document 1 discloses as follows. For the purpose of reducing a leak current caused by the increase of the light emitting intensity, a PN-junction in a lower part of a bonding electrode and a PN-junction of a light emitting part are separated from each other to obtain a gallium nitride semiconductor light emitting element having a more uniform characteristic by reducing a damage added to an active layer and preventing a crack of the active layer during film deposition, and reducing a warpage of the whole wafer to the utmost.

Patent document 2 discloses a comb-shaped electrode comprising a laminated body formed by laminating a n-type layer, an active layer, and a p-type layer on a substrate to flow a uniform current over an entire body of a light emitting surface, wherein the laminated body has parallel n-type electrode formation regions where in parallel with each other the n-type layer surfaces are exposed to form the n-type electrodes like lines, the n line electrode is each formed in the n-type electrode formation region, a translucent electrode is formed in the substantially entire n-type layer, the n-line electrodes are separated from each other and disposed at an equal distance, and n-type pad electrodes are formed at one end of each n-line electrode, and linear current diffusion conductors that are alternately disposed with the n-line electrodes and formed so as to be at equal distances from the adjacent n-line electrodes on the translucent electrode, and the p-pad electrodes are formed at one end of each of the current diffusion conductors.

PRIOR ART DOCUMENTS

Patent Documents

Patent document 1: Japanese Patent Laid Open Publication No. 2001-308380
Patent document 2: Japanese Patent Laid Open Publication No. 2005-328080

SUMMARY OF THE INVENTION

Problem to be Solved by the Invention

However, when a light emitting intensity is increased, inventors of the present invention considers that such an increase of a current amount flowing through a device has an adverse influence on a light emitting characteristic and a life span of a semiconductor device.

Therefore, in order to prevent such an adverse influence, it is found by the inventors of the present invention that it is preferable to flow a uniform current to a semiconductor that forms a light emitting layer. Then, from this viewpoint, patent documents 1 and 2 are examined.

When patent document 1 is examined from the aforementioned viewpoint, it is found that an object of the patent document 1 is to prevent a damage added on a light emitting part under a bonding electrode at the time of bonding, and as a method for diffusing a current, the current is simply diffused to go around an auxiliary electrode of a p-electrode, with a n-electrode as a center.

Further, patent document 2 describes a comb-shaped electrode wherein a pad electrode is formed at one end of a current diffusion conductor. However, with this structure, a plurality of pad electrodes are required for flowing a uniform current to a semiconductor that forms the light emitting layer, and such an electrode is considered to be not practical.

In view of the above-described circumstance, the present invention is provided, and an object of the present invention is to provide a light emitting element and a method for manufacturing the same capable of flowing a current by diffusing it to a semiconductor that forms a light emitting layer, without increasing the number of pad electrodes.

Means for Solving the Problem

Wherein, further pursuit is in progress by the inventors of the present invention, and it is found that when all n-type pad electrodes and auxiliary electrodes are formed on an n-type layer, a current is easily concentrated and flows after all to a part in which the n-type pad and the p-electrode are approached with each other, even if the auxiliary electrodes are extended to make the current spread. As a result, it is found that the current is not diffused as desired and a cause for not diffusing the current is that a part contacted with the n-type layer occupies the whole body of the n-type electrodes.

Based on this knowledge, it is found by the inventors of the present invention, that the current can be diffused and flowed to the semiconductor that forms the light emitting layer, by effectively arranging two or more first conductor electrode contact parts so as to be distributed discontinuously, without increasing the number of pad electrodes, and independently supplying the current to each first conductor electrode contact part using a conductive wiring. The present invention is thus completed.

Namely, in order to solve the aforementioned problem, a first invention provides a light emitting element, having:
a lamination structure including a first conductive layer and a second conductive layer with a light emitting layer interposed between them;
a groove structure in which the second conductive layer and the light emitting layer are divided into large and small two parts;
a second conductive electrode pad that is electrically connected to the second conductive layer on the divided larger second conductive layer,
a first conductive electrode pad on the divided smaller second conductive layer, and
two or more electrical contacts connected to the first conductive layer so as to be independent from each other, by a conductive wiring extending to the first conductive layer, with the first conductive electrode pad as a start point.

A second invention provides a light emitting element, having:
a lamination structure including a first conductive layer and a second conductive layer, with a light emitting layer interposed between them,
wherein the second conductive layer is divided into large and small parts by a groove structure that forms an exposure part of the first conductive layer, the light emitting element further having:

a second conductive electrode pad that is electrically connected to the second conductive layer on the divided larger second conductive layer;

a first conductive electrode pad that is electrically connected to the divided smaller second conductive layer; and a conductive wiring on the divided smaller second conductive layer and a side surface of a divided part, so as to extend to mutually independent two or more electrical contacts provided on the exposure part of the first conductive layer, with the first conductive electrode pad as a start point.

A third invention provides a light emitting element, having:

a lamination structure including a first conductive layer and a second conductive layer, with a light emitting layer interposed between them;

wherein the second conductive layer is divided into large and small parts by a groove structure that forms an exposure part of the first conductive layer, the light emitting element further having:

a second conductive electrode pad that is electrically connected to the second conductive layer on the divided larger second conductive layer;

a first conductive electrode pad that is electrically connected to the divided smaller second conductive layer; and mutually independent two or more electrical contacts provided on the exposure part of the first conductive layer, by a conductive wiring extending to the exposed first conductive layer, with the first conductive electrode pad as a start point.

A fourth invention provides the light emitting element according to any one of the first to third inventions, wherein a height from a bottom surface of the first conductive layer to an upper surface of the second conductive layer, and a height from the bottom surface of the first conductive layer to an upper surface of the first conductive electrode pad, are equal to each other.

A fifth invention provides the light emitting element according to any one of the first to fourth inventions, wherein the number X of the first conductive electrodes and the number Y of the second conductive electrode pads have a relation of X<Y and X+Y≥3.

A sixth invention provides a method for manufacturing a light emitting element, comprising:

forming a lamination structure including a first conductive layer, a light emitting layer, and a second conductive layer on a substrate in an order from the substrate side;

forming a groove structure for dividing the second conductive layer into large and small two parts by exposing the first conductive layer from the second conductive layer by etching;

forming a second conductive electrode pad on the divided larger second conductive layer;

forming a conductive wiring extending to an exposure part of the first conductive layer from the divided smaller second conductive layer; and forming a first conductive electrode pad on the divided smaller second conductive layer, wherein the conductive wiring has a part not extending to a part of the exposure part of the first conductive layer, and two or more mutually independent electrical contacts are formed on the exposure part of the first conductive layer, with the first conductive electrode pad as a start point.

Advantage of the Invention

According to the present invention a current is diffused and flowed through a semiconductor that forms a light emitting layer, thus providing a light emitting element capable of lessening degradation of a characteristic or lessening shortening of a life span due to current concentration, and further lessening a mounting failure.

BRIEF DESCRIPTION OF THE DRAWINGS

FIG. 1 is a schematic planar view of each step of a processing example of a light emitting element chip according to the present invention, wherein FIG. 1(a) is a planar view before processing, and FIG. 1(b) is a planar view after a pattern is formed by dry etching based on photolithography, and FIG. 1(c) is a planar view after a second electrode is formed by deposition, and FIG. 1(d) is a planar view after a first electrode is formed by deposition, and FIG. 1(e) is a planar view after an electrode pad is formed by deposition.

MODES FOR CARRYING OUT THE INVENTION

A light emitting element and a method for manufacturing the same will be described hereafter, with reference to the drawings. Note that typical examples of the light emitting element and the method for manufacturing the same are shown, and the present invention is not limited to these embodiments.

FIG. 1(a) to FIG. 1(e) are schematic planar views of each step in a processing example of a light emitting element chip according to the present invention.

FIG. 1(a) is a planar view before processing, and FIG. 1(b) is a planar view after a pattern is formed by dry etching, and FIG. 1(c) is a planar view after a second electrode is formed by deposition, and FIG. 1(d) is a planar view after a first electrode is formed by deposition, and FIG. 1(e) is a planar view after an electrode pad is formed by deposition.

Figure 1:
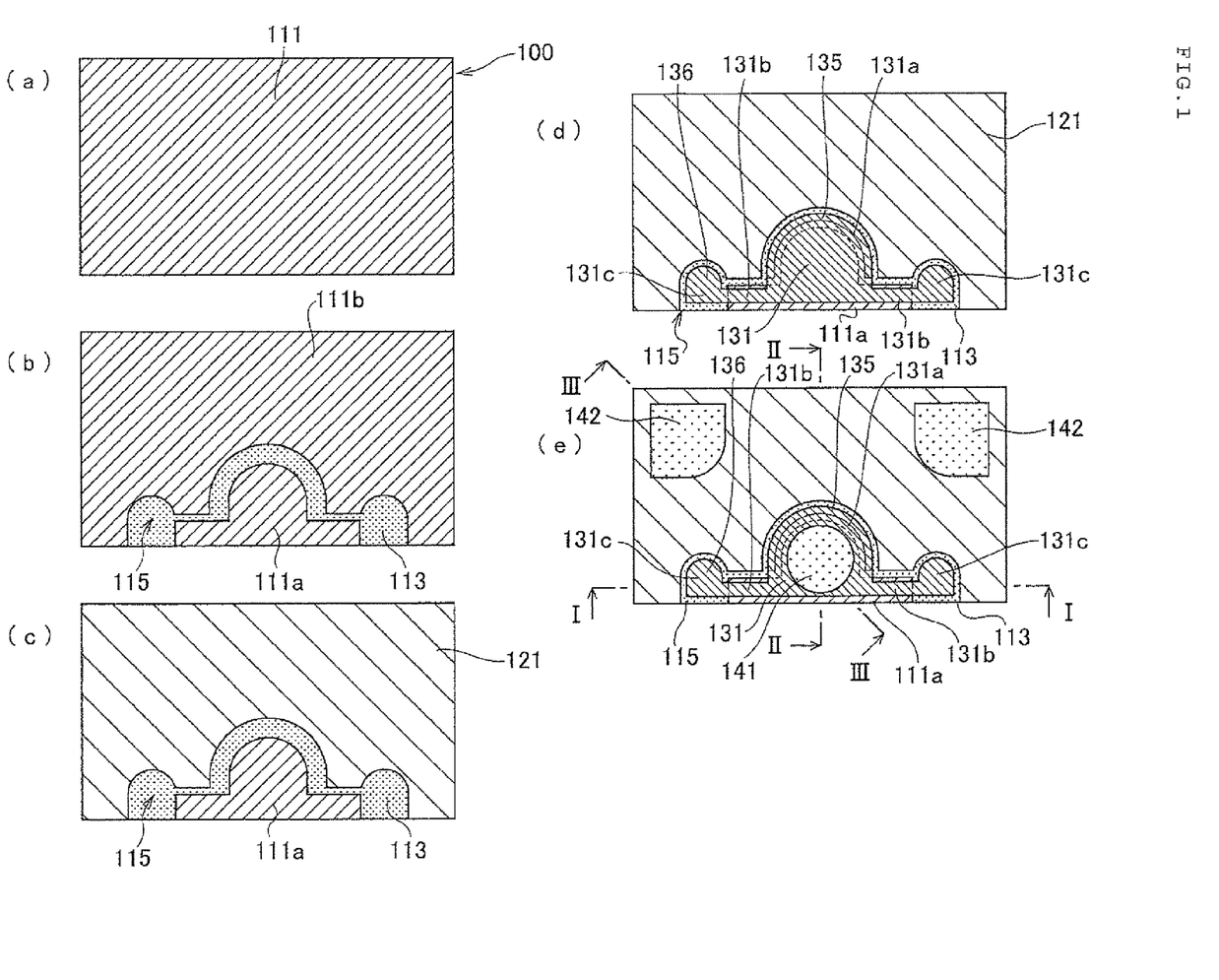
Figure 2:
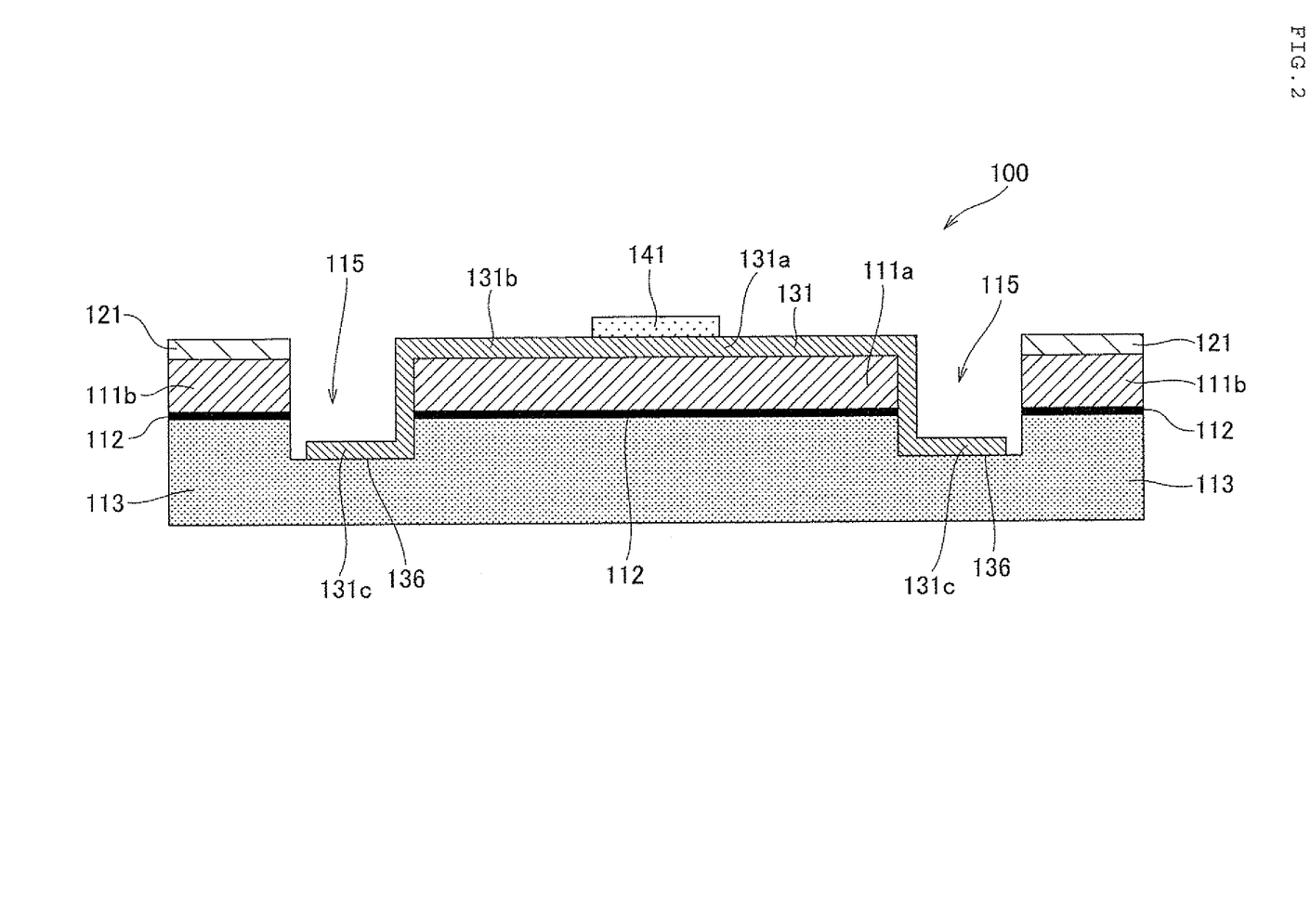
FIG. 2 is a cross-sectional view of FIG. 1(e) taken along the line I-I.
Figure 3:
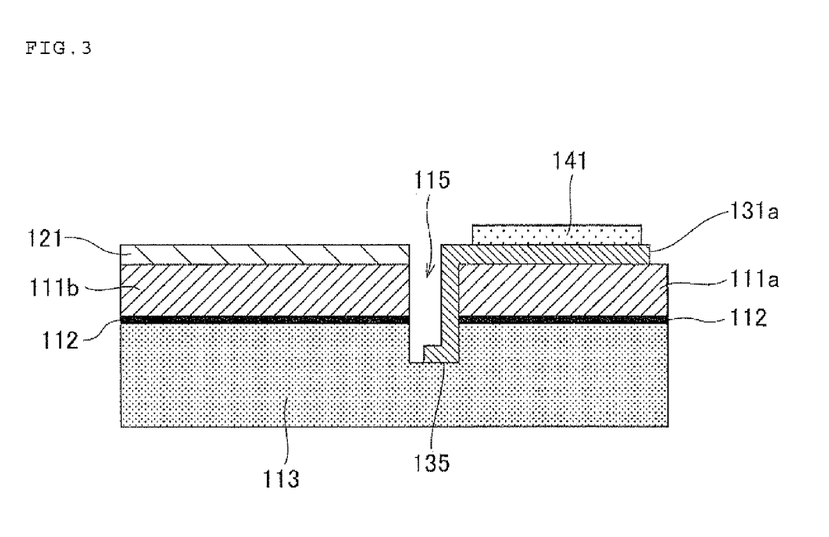
FIG. 3 is a cross-sectional view of FIG. 1(e) taken along the line II-II.
Figure 4:
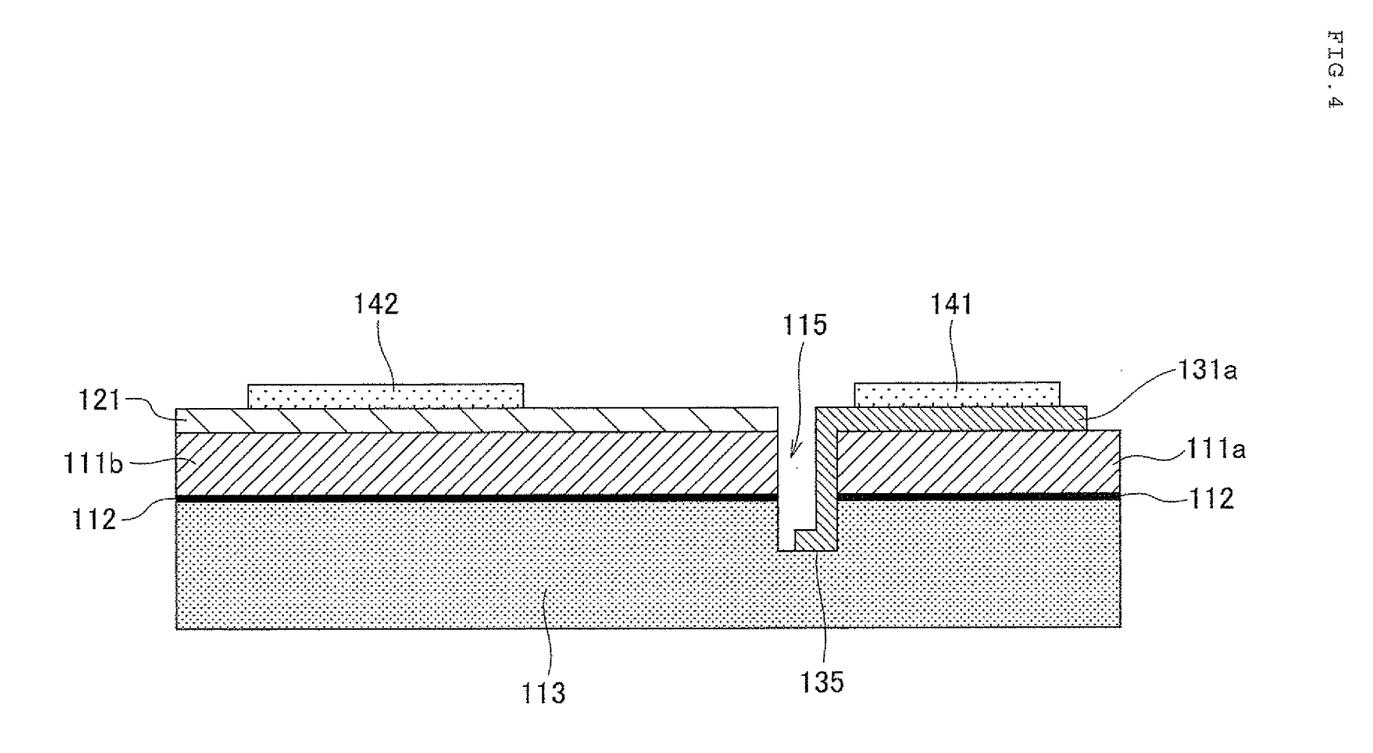
FIG. 4 is a cross-sectional view of FIG. 1(e) taken along the line III-III.

FIG. 2 is a cross-sectional view of FIG. 1(e) taken along the line I-I, and FIG. 3 is a cross-sectional view of FIG. 1(e) taken along the line II-II and FIG. 4 is a cross-sectional view of FIG. 1 taken along the line III-III.

FIG. 1(a) is a planar view before processing a light emitting element chip 100 according to the present invention, showing a second conductive layer 111. Wherein a light emitting layer 112 (not shown) as will be described later is formed on a lower layer of the second conductive layer 111, and a first conductive layer 113 is formed on further lower layer of the light emitting layer 112. These layers are semiconductor layers formed by deposition, on a growth substrate (not shown) such as a sapphire substrate.

In this embodiment, the first conductive layer is group III-V semiconductors such as n-type AlGaN, and the second conductive layer is the group III-V semiconductors such as p-type AlGaN, and the light emitting layer is the group 111-V semiconductors such as AlInGaN. However, n and p may be reversed, and GaN and InGaN, etc., in addition to AlGaN may also be acceptable as the semiconductor.

FIG. 1(b) is a planar view after a groove pattern is formed by dry etching (described as "RIE" in the present invention in some cases) after a mask pattern is formed by photolithography on the light emitting element chip 100 of the present invention.

$SiO_2$ mask is formed by CVD on the second conductive layer 111 of the light emitting element chip 100, to thereby form a mask pattern by photolithography. Then, the second conductive layer 111 not provided with a mask, and the light emitting layer 112 are removed, and the first conductive layer 113 is removed by etching up to its middle part, so that an exposure part 115 of the first conductive layer is formed, to thereby expose the first conductive layer 113.

Further, although not shown, a dividing groove is similarly formed by exposing the first conductive layer 113, with a sufficient width to separate the adjacent light emitting element chips 100 from each other.

As described above, explanation is given for a case that the first conductive layer 113 is removed by etching up to its middle part, so that the exposure part 115 of the first conductive layer is formed, to thereby expose the first conductive layer 113. Incidentally, the present invention is not limited to the case that the first conductive layer 113 is removed by etching up to its middle part, and the etching may be stopped at a point when the first conductive layer is exposed, or the first conductive layer may be completely removed. When the first conductive layer is completely removed, contact may be formed with an exposed side surface of the first conductive layer, or the first conductive layer may be supported by a conductive substrate, etc.

The groove pattern is used for separating the light emitting element chips 100 from each other, and separating the n-type electrode and the p-type electrode of each light emitting element chip 100 from each other, to thereby form the n-type electrode on the second conductive layer 111, for the purpose of obtaining an effect of uniformly diffusing and flowing the current through the first conductive layer. The second conductive layer 111 is divided into a relatively small second conductive layer 111a and a relatively large second conductive layer 111b.

After end of the RIE, the $SiO_2$ mask is removed by etching. However, the $SiO_2$ mask on the second conductive layer 111a may be remained, because it can be used as an insulating film as will be described later.

FIG. 1(c) is a planar view after a second electrode 121 is formed by deposition, on the light emitting element chip 100 according to the present invention.

The second electrode 121 is obtained by forming (Ni/Au) layer for example on the second conductive layer 111b. The electrode can be selected from an already known metal component. Note that in the figure, the second electrode 121 is preferably formed on the whole surface of the second conductive layer 111b, thus forming a whole-face electrode. The whole-face electrode has a function of forming a contact with the second conductive layer 111b and diffusing the current from the pad electrodes, and transmitting or reflecting a light emission of the light emitting layer.

FIG. 1(d) is a planar view after a first electrode 131 is formed by deposition, on the light emitting element chip 100 according to the present invention.

The first electrode 131 is obtained by forming (Ti/Al/Ti) layer for example extending from the second conductive layer 111a to the exposure part 115 of the first conductive layer. The electrodes can be selected from the already known metal component. Although details of the film deposition of the first electrode 131 extending to the exposure part 115 of the first conductive layer will be described later, deposited film 131a forming the first electrode 131 on a convex portion of the second conductive layer 111a, is formed extending to the exposure part 115 of the first conductive layer from the convex portion. As a result, a contact part 135 between the deposited film 131a forming the first electrode 131 and the first conductive layer 113, is formed in a periphery of the convex portion.

Further, deposited film 131b forming the first electrode on a portion of the second conductive layer 111a, which is not the convex portion, is not brought into contact with the exposure part 115 of the first conductive layer. Namely, deposited film 131 forming the first electrode has a portion not extending to a part of the exposure part of the first conductive layer. Then, film deposition of the first electrode 131 is carried out extending to the exposure part 115 of the first conductive layer, toward right and left directions from both ends of the convex portion of the second conductive layer 111a, to become the deposited film 131c forming the first electrode in contact with the exposure part 115 of the first conductive layer. As a result, a contact part 136 between the film 131 forming the first electrode 131 and the first conductive layer 113, is formed toward the right and left directions from the both ends of the convex portion.

FIG. 1(e) shows an example of a planar view after the electrode pad is formed by deposition, on the light emitting element chip 100 according to the present invention.

The electrode pad is obtained by forming (Ti/Au) layer for example on the convex portion of the second conductive layer 111a as a first conductor side electrode pad 141, and is obtained by forming (Ti/Au) layer for example at two paces or more of the second electrode 121 as a second conductor side electrode pad 142. The pad electrode can also be selected from the already known metal component.

Wherein, for example, the number X of the first conductive electrode pads and the number Y of the second conductive electrode pads have a relation of X<Y and X+Y≥3, like one first conductor side electrode pad 141, and two second conductor side electrode pads 142. Further, these electrode pads are preferably arranged non-linearly. This is because with this structure, even in a case of a Philip junction of the light emitting element chips 100, the light emitting element chips can be mounted without tilt. In order to prevent the tilt of one light emitting element chip 100, the number of electrode pads may be three at minimum.

After film deposition of the first conductor side electrode pad 141 and the second conductor side electrode pad 142, an insulating protective film such as $SiO_2$ and resin is formed on the light emitting element chip 100, and thereafter the protective film on the first and second conductor side electrode pads 141, 142 are removed.

Wherein, further explanation will be given for FIG. 1(e), with reference to the cross-sectional view of FIG. 2 taken along the line I-I, the cross-sectional view of FIG. 3 taken along the line II-II, and the cross-sectional view of FIG. 4(e) taken along the line III-III.

In FIG. 2 to FIG. 4, the semiconductor layer formed on the growth substrate (not shown) such as a sapphire substrate, includes the first conductive layer 113, the light emitting layer 112, and the second conductive layer 111 from below.

The groove pattern is engraved on the semiconductor layer so that the exposure part 115 of the first conductive layer is formed, to thereby expose the first conductive layer 113. Further, the groove pattern is formed by dividing the second conductive layer 111 into the second conductive layer 111a and the second conductive layer 111b. The second electrode 121 is formed by deposition, on the second conductive layer 111b. Meanwhile, the first electrode 131 is formed by deposition, on the second conductive layer 111a, and the first electrode 131 is formed by deposition not only on the second conductive layer 111a but also along a wall of the groove pattern, so that contact parts 135 and 136 are formed in contact with the exposed first conductive layer 113, to thereby secure electrical contact.

At this time, the electric contact can also be formed on upper surfaces of the first electrode 131 and the second conductive layer 111a, the side surface of the second conductive layer 111a, and the side surface of the light emitting layer 112. However, since the current flows to only the first conductive layer from the first conductor side electrode pad 141 through the first electrode 131, the electric contact with the second conductive layer 111a and the light emitting layer 112 can be ignored. Therefore, such an electric contact is not regarded as the electric contact in the present invention.

As a result, the first conductor side electrode pads 141 is brought into electrical contact with three places of the contact parts, such as the contact part 135 which is independently provided on the exposure part 115 of the first conductive layer and which is the contact part between the deposited film of the first electrode and the first conductive layer; and the contact parts 136 provided in right and left directions from both ends of the right and left convex portions of the second conductive layer, which are the contact parts between the deposited film of the first electrode and the first conductive layer, wherein the electrical contact is formed by using three conductive wirings starting from the first conductive electrode pad to be independently contacted with the exposed first conductive layer 115 respectively, wherein the film deposition 131a of the first electrode on the convex portion of the second conductive layer, film deposition 131b of the first electrode in a part which is not the convex portion on the second conductive layer, and film deposition 131c of the first electrode in contact with the exposed part of the first conductor, are regarded as the conductive wirings.

Wherein, it is also acceptable as desired, to provide four or more conductive wirings which are independently contacted with the exposed first conductive layer by changing the structure of the first electrode, and it is also acceptable to provide four or more mutually independent contact parts which are contact parts between the film deposition of the first electrode and the first conductive layer directed toward each direction from the convex portion of the second conductive layer.

Note that the present invention is not limited to the above-described structure, provided that a plurality of electric contacts can be formed by forming the contact parts between one first conductor side electrode pad 141 and two or more mutually independent first conductive layers 113.

Wherein, the first electrode 131 is preferably electrically insulated from the second conductive layer 111a and the light emitting layer 112. This is because a current leak to the surface of the semiconductor can be prevented by the aforementioned insulation.

Then, the first conductor side electrode pad 141 is formed by deposition, on the first electrode 131. Further, as shown in FIG. 4, the second conductor side electrode pad 142 is formed by deposition, on the second electrode 121. The pad electrodes can be formed simultaneously at the first conductor side and at the second conductor side, and can be formed by changing a thickness in another step, and a dimension from the first conductive layer 113 to the upper surfaces of the second conductor side electrode pads 141, 142 can be easily and exactly set to be equal to each other (difference of dimension: 200 nm or less in the present invention), in accordance with a difference of film thickness between the first electrode 131 and the second electrode 121. When the first conductor side electrode pad 141 is directly formed on the exposed first conductive layer as conventional, the difference of dimension from the first conductive layer 113 to the upper surface of the second conductor side electrode pad 142 is 1.3 µm or more for example. Therefore, it is difficult to align the height of the pad electrodes other than extremely thickening the thickness of the first conductor side electrode pad 141. When the first conductor side electrode pads having the aligned height are formed, application of vapor deposition requires a high cost, and therefore application of a plating method can be considered. However, thickness control by several nm is difficult in the plating method.

Therefore, according to the aforementioned structure, the relatively small second conductive layer 111a is not removed by etching, and therefore there is no necessity for changing a bonding position (height) for every pn, in a wire bonding step or a flip chip mounting step of the light emitting element chip 100, and suppression of a failure such as connection failure or tilt of the chips can be prevented at a low cost, with high precision.

When the current is flowed to the light emitting element chip 100 of the present invention, it is found that the light emitting element has a high light emission efficiency. Probably this is because diffused current flows uniformly to the first conductive layer 113, and uniform light emission is executed in the light emitting layer 112 with high efficiency.

As described above, explanation will be given for a case that the first conductive layer is group III-V semiconductors such as n-type AlGaN, and the second conductive layer is the group III-V semiconductors such as p-type AlGaN, and the light emitting layer is the group III-V semiconductors such as AlInGaN.

Electrons flowed to the first conductor side electrode pad 141, easily pass through the first electrode 131 having metal conductivity, to flow the first conductive layers 113 from the contact parts 135 and 136. In this embodiment, since the contact parts 135 and 136 are provided in a wide range, so as to be distributed on the first conductive layer 113. Therefore, the electrons flowed to the first conductive layer 113, are uniformly flowed over a wide range of the light emitting layer 112. The electrons flowed to the first conductive layer 113, uniformly pass through the light emitting layer 112 in a wide range, so that light emission is uniformly executed with high efficiency by the light emitting layer 112.

Thereafter, the electrons flow to the second electrode 121 having metal conductivity, from the second conductor side layer 111, and flow out from the second conductor side electrode pad 142. Wherein, by providing the second conductor side electrode pads 142 at a plurality of places so as to be distributed, the electrons flowed to the first conductive layer 113 are secured to uniformly pass through the light emitting layer 112 over a wide range. Namely, similarly to the explanation of paragraph (0026), the relation of X<Y and X+Y≥3 is preferable, and the electrode pads are preferably non-linearly arranged.

As described above in detail, according to the present invention, the contact parts distributed at a plurality of places with respect to one pad electrode can be arranged. As a result, the current can be uniformly diffused to the first conductive layer, the light emitting layer, and the second conductive layer, thus making it possible to obtain the light emitting element capable of lessening the degradation of the characteristic due to current concentration, and capable of reducing a short life-span.

Further, according to the present invention, the heights of the first and second conductor side electrode pads can be easily set to be equal to each other. As a result, there is no necessity for changing a bonding position (height) for every pn, in a wire bonding step or a flip chip mounting step, and suppression of a failure such as connection failure or tilt of the chips can be prevented at a low cost, with high precision.

Note that according to the structure of forming the electrode wiring which is branched to the mutually independently distributed contact parts contacted with the first conductive layer, by leaving the relatively small second conductive layer 111a and utilizing its upper surface and side surface, the first electrode 131 can be formed into a wedge shape or a radial shape, in accordance with a chip size or the shape of the second electrode pad 142.

EXAMPLES

The present invention will be specifically described hereafter, using examples.

Example 1

AlN template having AlN buffer was prepared for a sapphire substrate as a growth substrate (not shown), to thereby fabricate a sample of a light emitting structure with a light emission wavelength of 465 nm on the growth substrate, as a superlattice buffer layer (not shown) with a thickness of 745 nm, n-AlGaN layer with a thickness of 1722 nm as the first conductive layer 113, MQW active layer with a thickness of 184 nm being the light emitting layer 112, p-AlGa layer with a thickness of 282 nm as the second conductive layer 111, and p-GaN with a thickness of 22 nm being the contact layer (not shown).

Suitable surface cleaning and annealing were applied to the sample of the light emitting structure, to thereby form a $SiO_2$ mask for RIE on the p-GaN contact layer, using a photolithography method. Then, etching of a depth of about 1.3 μm was applied to a portion exposed from the $SiO_2$ mask, in a depth from the p-GaN contact layer to the n-AlGaN layer, so that a part of the n-AlGaN layer was exposed. By this etching, a dividing groove being the exposure part 115 of the first conductive layer was formed for individually dividing the elements of the example 1, and the light emitting element chip 100 thus individually divided by this dividing groove, was further divided into the relatively large second conductive layer 111b being a light emitting body, and the relatively small second conductive layer 111a being a n-electrode pad forming part. Thereafter, the $SiO_2$ mask was removed.

First, in the p-AlGaN layer being the relatively large second conductive layer 111b, Ni layer with a thickness of 5 nm being the second electrode 121 and Au layer with a thickness of 20 nm were formed on the p-GaN contact layer by sputtering, to thereby form a p-electrode and remove a portion excluding the p-electrode by etching.

Meanwhile, on the p-AlGaN layer being the relatively small second conductive layer 111a, a resist mask was formed using the photolithography method so as to expose a portion from the p-GaN contact layer to apart of the exposed n-AlGaN layer (each independently distributed contact part). Wherein, the resist mask is also formed on apart of the second conductive layer 111a to obtain an electric wiring shape in which the contact parts are independently distributed. Then, Ti layer with a thickness of 18 nm, Al layer with a thickness of 300 nm, and Ti layer with a thickness of 5 nm, were formed by deposition as the first electrode 131 by sputtering, which were then lifted-off, to thereby integrally form the n-electrode having the deposited film 131a forming the first electrode which is a size larger than the convex portion of the second conductive layer and extending to the first conductive layer, the deposited film 131b forming the first electrode formed on only the second conductive layer on a part of the second conductive layer not including the convex portion, and the deposited film 131c forming the first electrode which is brought into contact with the exposure part of the first conductor by the electric wiring of the deposited film 131b. In this electric wiring, the n-electrode extends to a part of the exposed n-AlGaN layer (each distributed contact part) from the relatively small second conductive layer 111a, including the side surface of a division part.

Wherein, by annealing at 550° C., the electric contact between the p-electrode and the p-contact layer was formed in the relatively large second conductive layer 111b, and the electric contact (ohmic connection) was formed in the contact part 135 and the right and left contact parts 136, between the exposed first conductive layer 113 in the periphery of the relatively small second conductive layer 111a and the n-electrode.

As a result, the first conductor side electrode pads 141 are brought into electrical contact with three parts of the contact parts, such as the contact part 135 which is independently provided on the exposure part 115 of the first conductive layer and which is the contact part between the deposited film of the first electrode and the first conductive layer, and the contact parts 136 between the deposited film of the first electrode and the first conductive layer directed toward the right and left directions from the both ends of the right and left two convex portions of the second conductive layer, wherein the electrical contact is formed using the deposited film 131a of the first electrode on the convex portion of the second conductive layer, the deposited film 131b of the first electrode in a portion which is not the convex portion on the second conductive layer, and the deposited film 131c of the first electrode in contact with the exposed part of the first conductor, which are regarded as the conductive wirings extending to the exposed first conductive layer starting from the first conductive electrode pad.

Thereafter, Pt layer with a thickness of 50 nm, Au layer with a thickness of 100 nm, and Ti layer with a thickness of 5 nm, were formed on the p-electrode, as the film (not shown) of the p-electrode.

Next, a resist mask was provided thereon to expose a part of the p-electrode and the n-electrode, and Ti layer with a thickness of 5 nm, Au layer with a thickness of 500 nm, and Ti layer with a thickness of 10 nm were formed as the n-electrode pad and the p-electrode pad, and thereafter the pad electrodes were formed by lift-off. Next, $SiO_2$ layer was formed on the whole surface as a protective film, which was then masked by resist so that a part of the p—electrode pad and the n-electrode pad is exposed, and SiO$_2$ layer and the Ti layer on the pad were removed by RIE, to thereby form Au pad electrodes being the first conductor side electrode pad 141 and the second conductor side electrode pad 142.

Thereafter, the resist mask was removed, and after cleaning, the dividing groove provided around the light emitting element chip 100 was scribed after grinding and polishing of the substrate, to thereby obtain the individually divided light emitting element chip 100.

Figure 5:
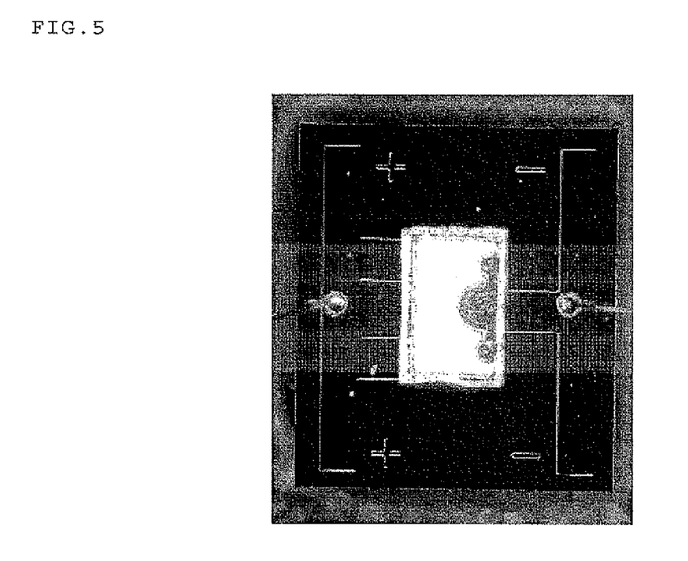
FIG. 5 shows a photograph of an outer appearance of about 48.5 magnifications, showing a light emission state of a light emitting element according to example 1.

FIG. 5 shows a photograph of a manufactured outer appearance of a light emission state of the light emitting element according to example 1, which is about 48.5 magnifications, photographed by the optical microscope. A light emission area of the light emitting element was $1.04 \times 10^{-7}$ m$^2$. When the current of 20 mA was flowed to the light emitting element, a forward voltage (Vf) was 3.11V, and an optical output (Po) by an integrating sphere was 3.22 mW.

Figure 6:
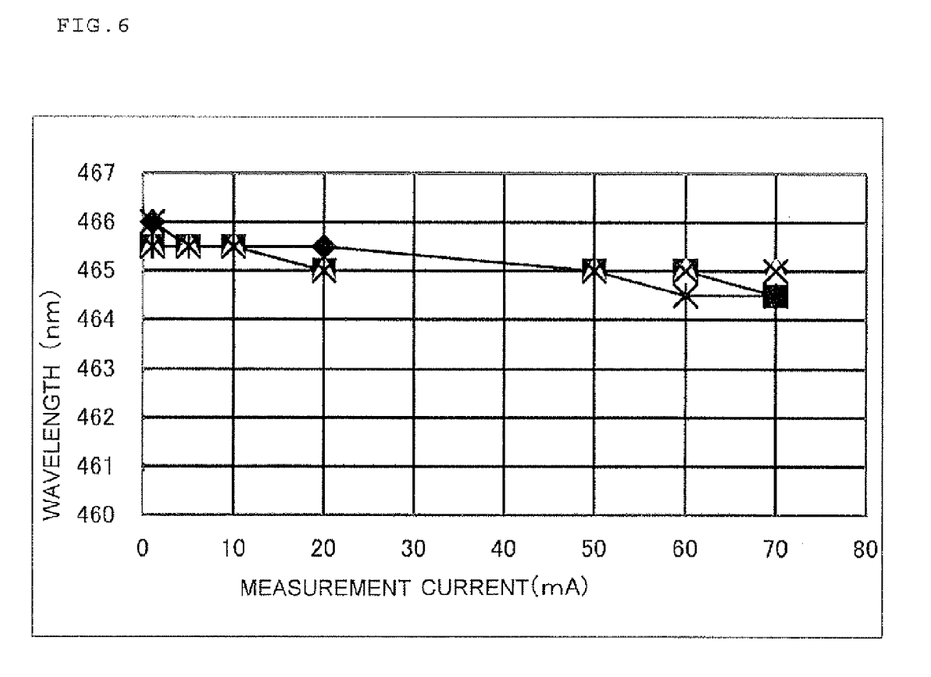
FIG. 6 is a graph showing a relation between a light emission wavelength and a current in the light emitting element according to example 1.

Further, the light emission wavelength at the time of flowing the current of 1 to 70 mA to the light emitting element, was measured. The measurement result is shown in FIG. 6. FIG. 6 shows a graph in which values of a measured current are taken on the horizontal axis, and the light emission wavelengths are taken on the vertical axis, and measurement results of 5 samples of the light emitting elements of example 1 are plotted.

Comparative Example 1

A light emitting element according to comparative example 1 was manufactured by executing a similar process as the process of example 1, excluding a point that the exposure part 115 of the first conductive layer, the deposited film 131*b* forming the first electrode in a part of the second conductive layer which is not the convex portion, and the deposited film 131*c* forming the first electrode in contact with the exposure part of the first conductor, were not provided.

Figure 9:
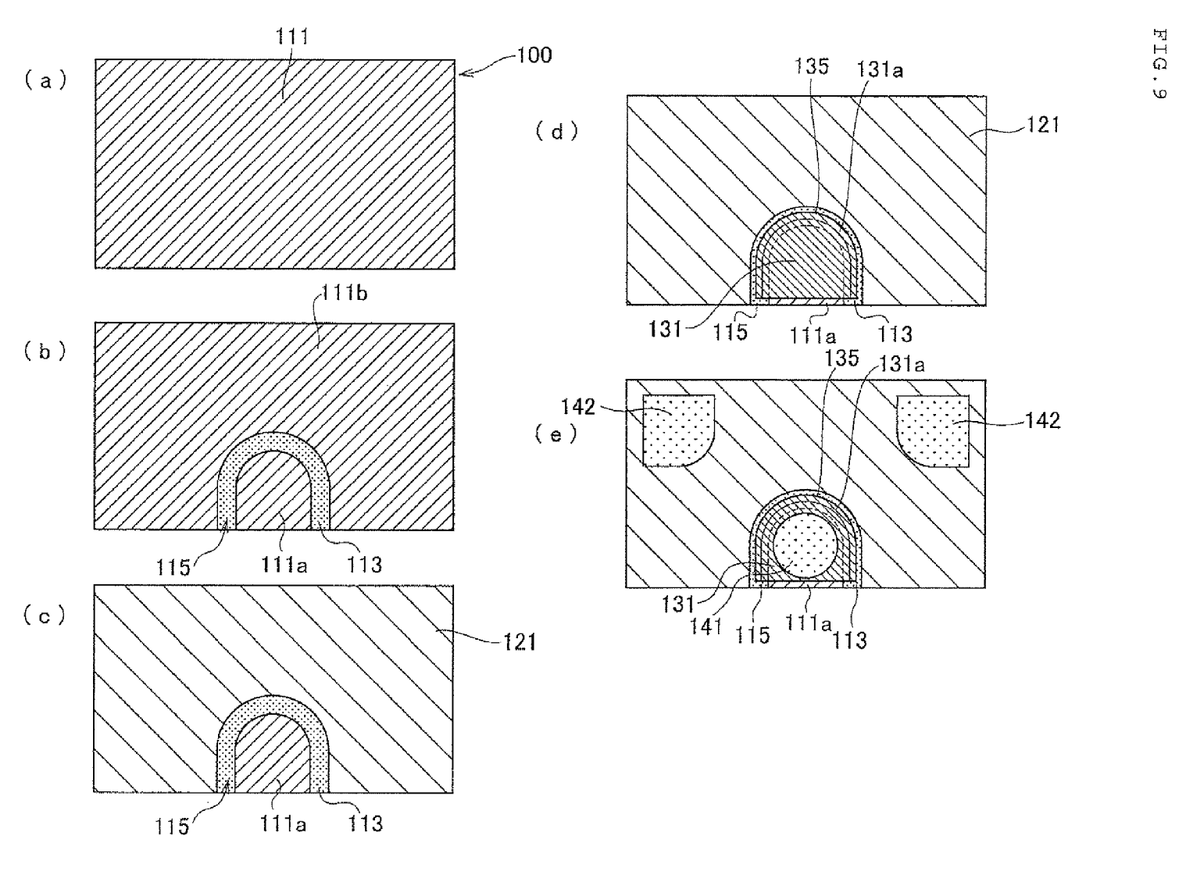
FIG. 9 is a schematic planar view of each step in the processing example of the light emitting element chip according to comparative example 1, wherein explanation for each figure of (a) to (e) is similar to that of FIG. 1.

FIG. 9(*a*) to FIG. 9(*e*) are planar views of the method for manufacturing the light emitting element according to comparative example 1.

As shown in FIG. 9(*b*), in comparative example 1 as well, similarly to example 1, the exposure part 115 of the first conductive layer was formed to thereby expose the first conductive layer 113. However, unlike the light emitting element of example 1, the contact part between the first electrode 131 and the first conductive layer 113 was formed only in the circumference of the first conductor side electrode pad 141 (namely, only one continuous part), and both the exposure part 115 of the first conductive layer and the second conductive layer 111 are not developed in right and left directions.

As shown in FIG. 9(*d*), unlike the example 1, in comparative example 1, the exposure part 115 of the first conductive layer is not developed in right and left directions, and therefore the deposited film 131*a* forming the first electrode 131 on the convex portion of the second conductive layer 111*a*, was formed by deposition, extending to the exposure part 115 of the first conductive layer from the convex portion. As a result, the contact part 135 between the deposited film 131*a* forming the first electrode 131 and the first conductive layer 113 was formed in the periphery of the convex portion.

As shown in FIG. 9(*e*), based on the aforementioned step, blue LED with a light emission wavelength of 465 nm was manufactured as the light emitting element according to comparative example 1.

Figure 7:
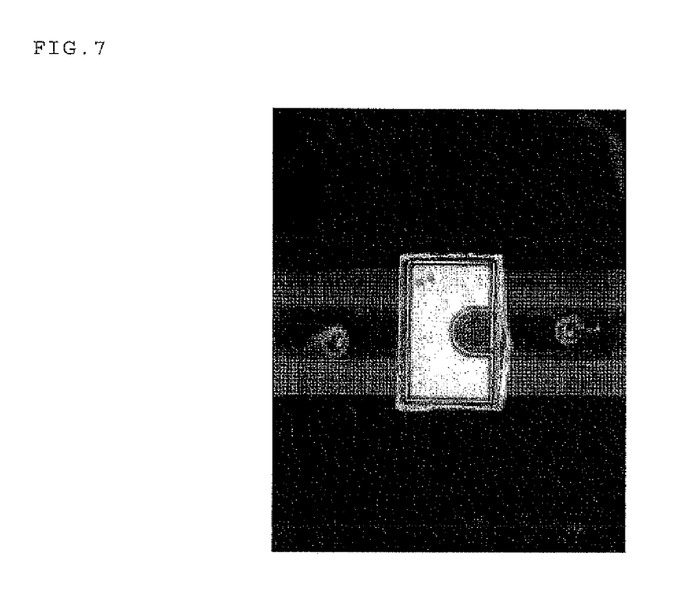
FIG. 7 is a photograph of an outer appearance of about 48.5 magnifications showing a light emission state of the light emitting element according to a comparative example.

FIG. 7 is a photograph of an outer appearance of about 48.5 magnifications, showing a light emitting state of the manufactured light emitting element according to comparative example 1. A light emission area of the light emitting element was $1.42 \times 10^{-7}$ m$^2$.

Wherein, when the current of 20 mA was flowed to the light emitting element, Vf was 3.03V, and Po was 3.45 mW.

Figure 8:
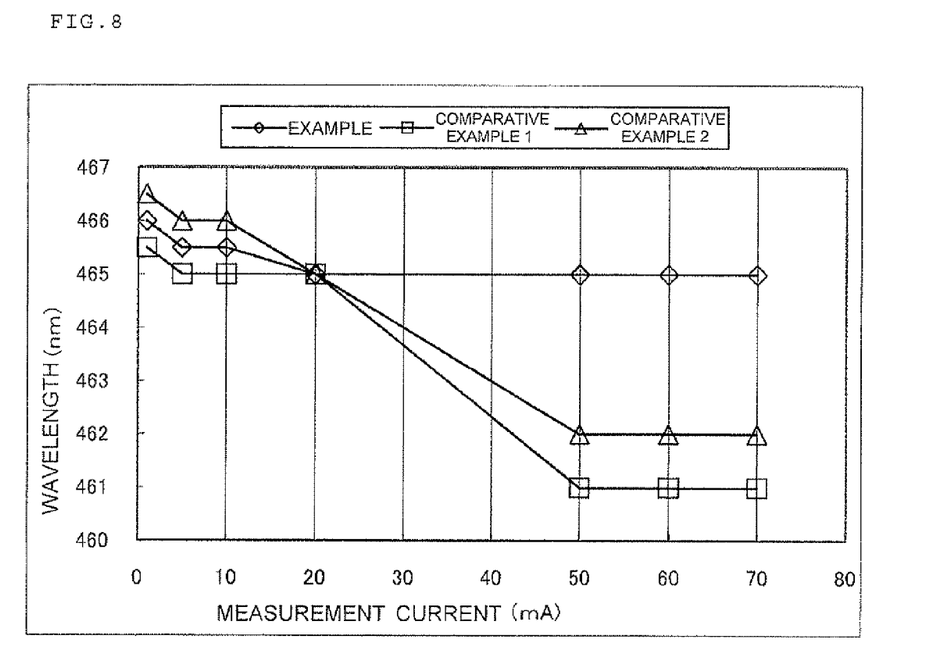
FIG. 8 is a graph showing a relation between the light emission wavelength and the current in the light emitting element according to example 1, and comparative examples 1 and 2.

Further, the light emission wavelength at the time of flowing the current of 1 to 70 mA to the light emitting element of comparative example 1, was measured. The measurement result is shown in FIG. 8. FIG. 8 shows a graph in which measurement results of three examples of the light emitting elements of comparative example 1 are averaged and plotted by -□-, wherein values of the measurement current is taken on the horizontal axis, and light emission wavelengths are taken on the vertical axis. Note that in FIG. 8, the measurement results of one sample selected from the samples of the light emitting element of example 1 are plotted by -◇-.

Comparative Example 2

A light emitting element according to comparative example 2 was manufactured by executing a similar operation as the operation of example 1, excluding a point that the shape of the relatively small second conductive layer was formed in a similar shape as the shape of comparative example 1.

Figure 10:
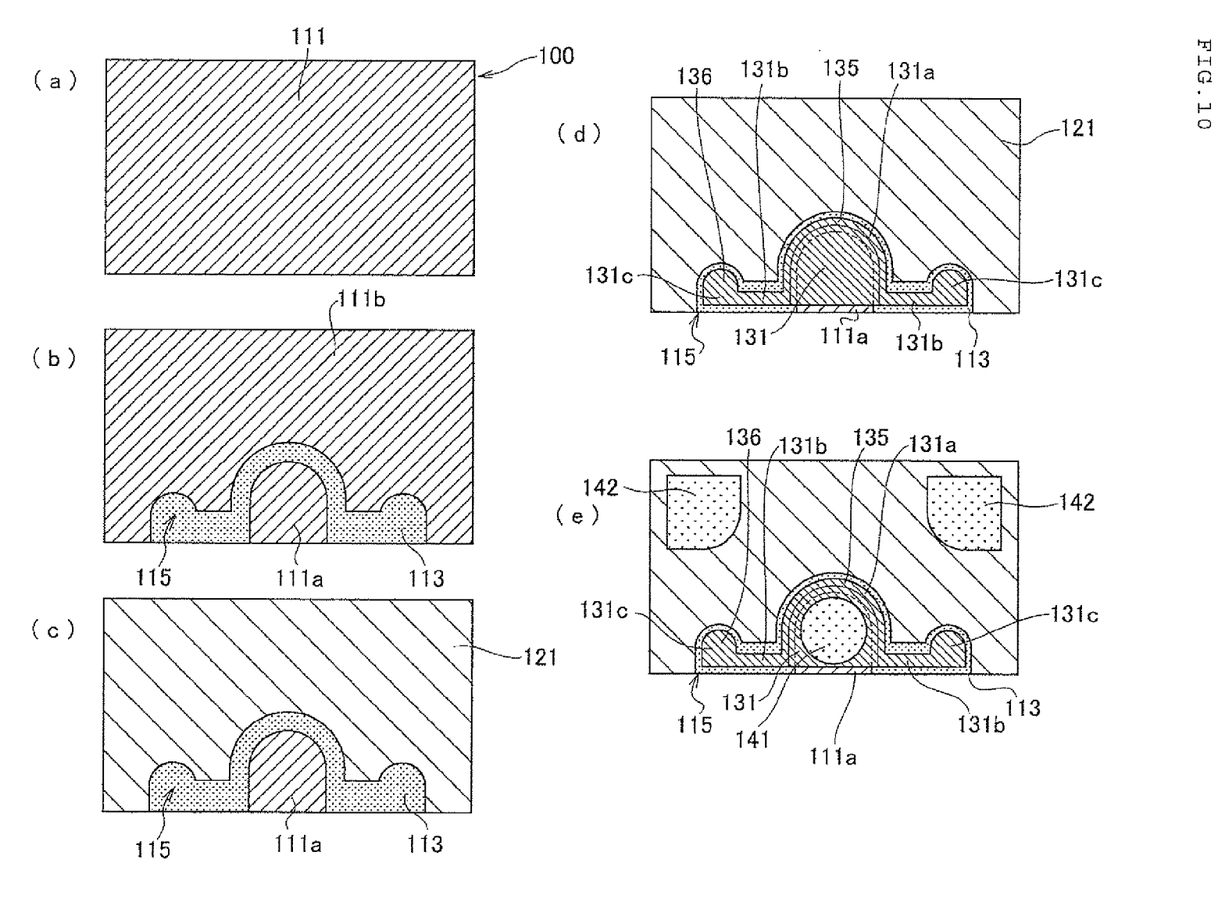
FIG. 10 is a schematic planar view of each step in the processing example of the light emitting element chip according to comparative example 2, wherein explanation of each figure of (a) to (e) is similar to that of FIG. 1.

FIG. 10(*a*) to (*e*) are planar views of the light emitting element and the method for manufacturing the same according to comparative example 2.

As shown in FIG. 10(*b*), in comparative example 2, the shape of the relatively small second conductive layer 111*a* was formed only in the circumference of the first conductor side electrode pad 141 similarly to the comparative example 1, and a shape not developing in right and left directions was formed.

As shown in FIG. 10(*d*), in comparative example 2, although the second conductive layer 111*a* was not developed in right and left directions unlike example 1, the deposited film 131*a* forming the first electrode 131 was formed extending to the exposure part 115 of the first conductive layer from the convex portion.

As a result, in the light emitting element according to comparative example 2, unlike the light emitting element according to example 1, although the upper surface and the side surface of the second conductive layer 111*a* are utilized, an electrode wiring for the mutually independently distributed first conductive layer is not formed, and the contact part (electric contact) between the first electrode 131 and the first conductive layer 113 are not formed independently from each other. Therefore, all wiring parts extending in the right and left directions in the circumference of the first conductor side electrode pad 141, are continuously formed.

As shown in FIG. 10(*e*), based on the aforementioned step, blue LED with a light emission wavelength of 465 nm was manufactured as the light emitting element according to comparative example 2.

The light emission area of the light emitting element according to comparative example 2, was $1.04 \times 10^{-7}$ cm$^2$. When the current of 20 mA was flowed to the light emitting element, Vf was 3.01V, and Po was 3.52 mW.

The measurement results of the sample of the light emitting element according to comparative example 2 was also plotted by -△- in FIG. 8.

Comparative Example 3

A light emitting element according to comparative example 3 was manufactured by executing a similar operation as the operation of example 1, excluding a point that the first conductive layer is exposed, which is the layer of a part of the relatively small second conductive layer of comparative example 3, without forming the relatively small second conductive layer.

FIG. 11(a) to (e) are planar views of the light emitting element and the method for manufacturing the same according to comparative example 3.

Figure 11:
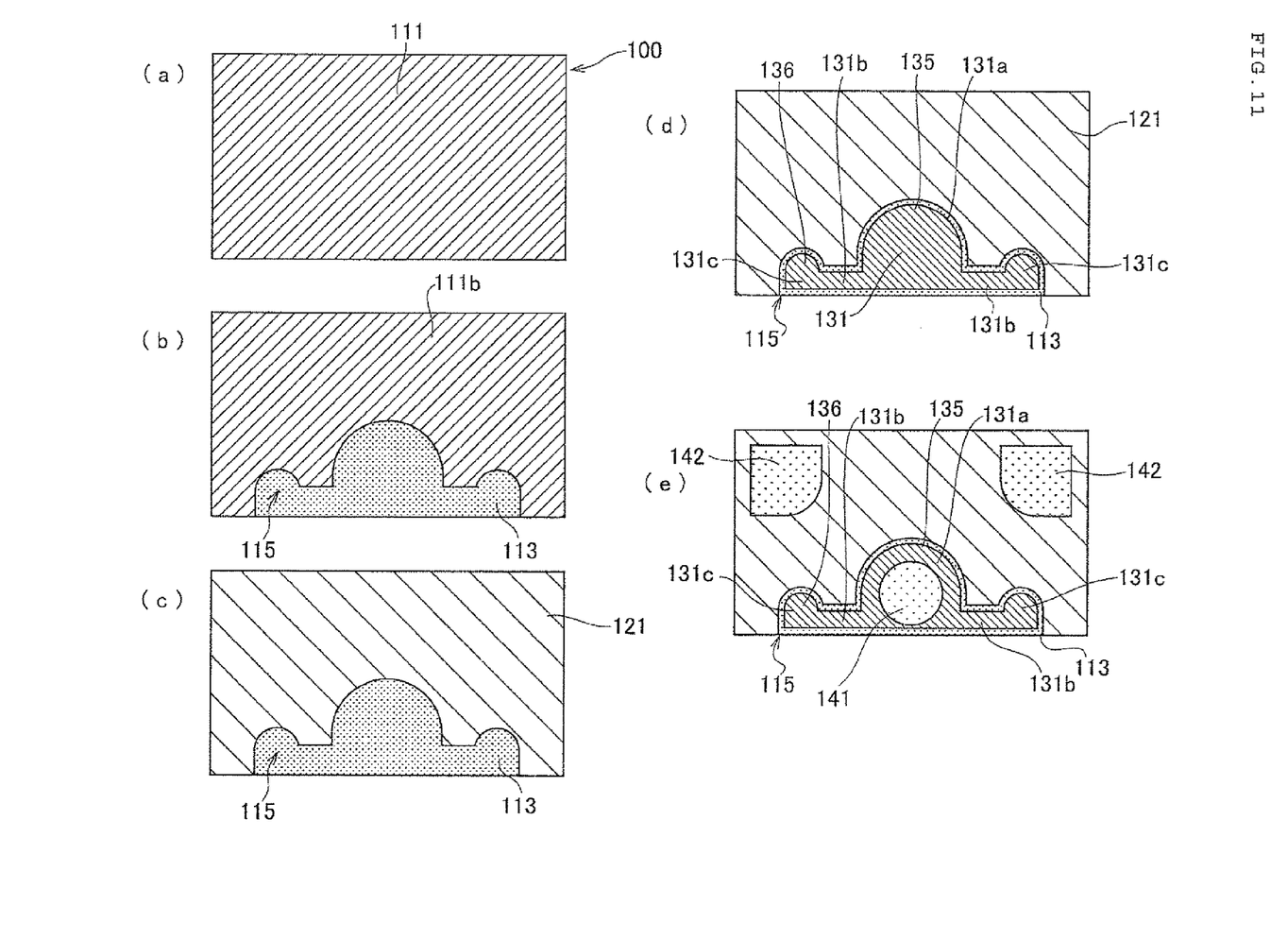
FIG. 11 is a schematic planar view of each step in the processing example of the light emitting element chip according to comparative example 3, wherein explanation of each figure of (a) to (e) is similar to that of FIG. 1.

As shown in FIG. 11(b), in comparative example 3, unlike the example 1, $SiO_2$ mask was not formed on the relatively small second conductive layer portion, and a portion becoming the relatively smaller second conductive layer was removed by etching together with other part during formation of the exposure part by RIE thus not forming the relatively small second conductive layer 111a.

As shown in FIG. 11(d), in comparative example 3, unlike the example 1, although the second conductive layer 111a was not formed, the deposited film 131a forming the first electrode 131 was formed extending to the exposure part 115 of the first conductive layer from the convex portion.

As a result, comparative example 3 provides the first electrode 131 having the same shape as the shape of example 1 directly formed on the first conductive layer 113. Wherein, a similar point as comparative example 2 is that the contact parts (electric contacts) between the first electrode 131 and the first conductive layer 115 are not independently formed from each other, and all wiring parts in the circumference of the first conductor side electrode pad 141 are continuously formed so as to extend in the right and left directions.

As shown in FIG. 11(e), based on the aforementioned step, blue LED with a light emission wavelength of 465 nm was manufactured as the light emitting element according to comparative example 3.

CONCLUSION

The light emitting element according to example 1, and the light emitting element according to comparative example 1, have different shapes of the first conductive layers. There is a difference between the shapes of the second electrode and the light emission area due to the difference in the shape. Therefore, the light emission area of the light emitting element of comparative example 1 is larger. Owing to a large light emission area, the light emitting element of comparative example 1 has slightly lower Vf and higher Po. However, an amount of the shift of the light emission wavelength by the change of a current amount flowing to the light emitting element is larger in the light emitting element of comparative example 1 as shown in FIG. 8. This is because in the light emitting element of comparative example 1, the current flows to a part of the light emitting layer by being concentrated thereto, and therefore heat generation occurs in this concentration part, thus changing the light emission wavelength by this heat generation.

Further, when the light emitting element of example 1 and the light emitting element of comparative example 2 are compared, both have the same light emission area. However, there is a difference between the light emitting element of example 1, and the light emitting element of comparative example 2, such that the electric contacts are independent from each other in the former, and the electric contacts are continuous in the latter. Vf is slightly lower and Po is higher in the light emitting element of comparative example 2 during power supply of 20 mA, compared with the light emitting element of example 1, due to the difference in the electric contacts. However, as shown in FIG. 8, similarly to the light emitting element of comparative example 1 as described above, the amount of shift of the light emission wavelength by the change of the amount of current flowed to the light emitting element, is larger in the light emitting element of comparative example 2. Note that the light emitting element of comparative example 3 shows a similar tendency of the light emitting element of comparative example 2 (not shown in FIG. 8).

Probably, this is because similarly to the aforementioned light emitting element of comparative example 1, in the light emitting element of comparative example 2 as well, priority is given to the flow of the current from the circumference of the pad electrode, and the current flows in such a manner as concentrating to a part of the light emitting layer, and as a result, heat generation occurs in this current concentration part, thus changing the light emission wavelength by this heat generation. This situation also occurs in the light emitting element of comparative example 3.

Further, when the amount of current exceeds 50 mA due to reduction of light emitting efficiency by this heat generation, Po of the light emitting element of example 1, and Po of the light emitting element of comparative example 2 are same levels.

It was found by a conduction life test at current amount of 40 mA at room temperature, that the light emitting element of example 1 was capable of maintaining 92% of an initial output in 1000 hours, and meanwhile the light emitting element of comparative example 2 was capable of maintaining 88% of an initial output in 1000 hours.

As described above, it was found that the light emitting element of example 1 had less characteristic deterioration due to concentration of the current, which was an excellent light emitting element with long life-span, compared with the light emitting elements of comparative examples 1, 2, and 3.

Meanwhile, in the light emitting element of comparative example 3, a dimension difference between the first electrode and the second electrode was 1.3 μm. As a result, in the flip-chip mounting step, which is a post-process, when a gold bump with a size of about 100 μm was bonded to the first conductor side electrode pad and the second conductor side electrode pad, and thereafter chips were bonded thereto by thermocompression, 5% connection failure was generated in the light emitting element of comparative example 3.

Meanwhile, in the light emitting element of example 1 and comparative examples 1 and 2, the connection failure was not generated even when the same mounting method as the mounting method of comparative example 3 was executed.

As described above, it was found that the light emitting element of example 1 was excellent in productivity, such that the connection failure was not generated in the flip-chip mounting step, compared with the light emitting element of comparative example 3.

As described above, it was found that the light emitting element of the present invention was excellent in reliability, with less characteristic deterioration due to concentration of the current, less shortening of life-span, and less mounting failure.

DESCRIPTION OF SIGNS AND NUMERALS

100 Light emitting element chip
111 Second conductive layer
111a Second conductive layer
111b Second conductive layer
112 Light emitting layer
113 First conductive layer
115 Exposure part of first conductive layer
121 Second electrode
131 First electrode 131a Film of the first electrode on a convex portion of the second conductive layer
131b Film of the first electrode on a portion of the second conductive layer not including the convex portion
131c Film of the first electrode in contact with the exposure part of the first conductor
135 Contact part between the film of the first electrode and the first conductive layer
136 Contact part between the film of the first electrode and the first conductive layer in right and left directions from both ends of the convex portion of the second conductive layer
141 First conductor side electrode pad
142 Second conductor side electrode pad

The invention claimed is:

1. A light emitting element, having a lamination structure including a first conductive layer and a second conductive layer with a light emitting layer interposed between them; a groove structure in which the second conductive layer and the light emitting layer are divided into large and small two parts; a second conductive electrode pad that is electrically connected to the second conductive layer on the divided layer second conductive layer, a first conductive electrode pad on the divided smaller second conductive layer, and two or more electrical contacts connected to the first conductive layer so as to be independent from each other, by a conductive wiring extending to the first conductive layer, with the first conductive electrode pad as a start point, wherein the X of the first conductive electrode pads and the number Y of the second conductive electrode pads have a relation of X<Y and X+Y≥3, wherein a height from a bottom surface of the first conductive layer to an upper surface of the second conductive electrode pad, and a height from the bottom surface of the first conductive layer to an upper surface of the first conductive electrode pad, are equal to each other.

2. A light emitting element, having: a lamination structure including a first conductive layer and a second conductive layer, with a light emitting layer interposed between them, wherein the second conductive layer is divided into a large and small parts by a groove structure that forms an exposure part of the first conductive layer, the light emitting element further having: a second conductive electrode pad that is electrically connected to the second conductive layer on the divided lager second conductive layer; a first conductive electrode pad that is electrically connected to the divided smaller second conductive layer; and a conductive wiring on the divided smaller second conductive layer and a side surface of a divided part, so as to extend to mutually independent two or more electrical contacts provided on the exposure part of the first conductive layer, with the first conductive electrode pad as a start point, wherein the number X of the first conductive electrode pads and the number Y of the second conductive electrode pads have a relation of X<Y and X+Y≥3, wherein a height from a bottom surface of the first conductive layer to an upper surface of the second conductive electrode pad, and a height from the bottom surface of the first conductive layer to an upper surface of the first conductive electrode pad, are equal to each other.

3. A light emitting element, having: a lamination structure including a first conductive layer and a second conductive layer, with a light emitting layer interposed between them; wherein the second conductive layer is divided into large and small parts by a groove structure that forms an exposure part of the first conductive layer, the light emitting element further having: a second conductive electrode pad that is electrically connected to the second conductive layer on the divided larger second conductive layer; a first conductive electrode pad that is electrically connected to the divided smaller second conductive layer; mutually independent two or more electrical contacts provided on the exposure part of the first conductive layer, by a conductive wiring extending to the exposed first conductive layer, with the first conductive electrode pad as a start point, wherein the number X of the first conductive electrode pads and the number Y of the second conductive electrode pads have a relation of X<Y and X+Y≥3, wherein a height from a bottom surface of the first conductive layer to an upper surface of the second conductive electrode pad, and a height from the bottom surface of the first conductive layer to an upper surface of the first conductive electrode pad, are equal to each other.

4. A method for manufacturing a light emitting element, comprising: forming a lamination structure including a first conductive layer, a light emitting layer, and a second conductive layer on a substrate in an order from the substrate side; forming a groove structure for dividing the second conductive layer into large and small two parts by exposing the first conductive layer from the second conductive layer by etching; forming a second conductive electrode pad on the divided larger second conductive layer; forming a conductive wiring extending to an exposure part of the first conductive layer from the divided smaller second conductive layer; and forming a first conductive electrode pad on the divided smaller second conductive layer, wherein the conductive wiring has a portion not extending to a part of the exposure part of the first conductive layer, and two or more mutually independent electrical contacts are formed on the exposure part of the first conductive layer, with the first conductive electrode pad as a start point, and wherein the number X of the first conductive electrode pads and the number Y of the second conductive electrode pads have a relation of X<Y and X+Y≥3, wherein a height from a bottom surface of the first conductive layer to an upper surface of the second conductive electrode pad, and a height from the bottom surface of the first conductive layer to an upper surface of the first conductive electrode pad, are equal to each other.

* * * * *